United States Patent [19]

Ishida et al.

[11] 4,176,290
[45] Nov. 27, 1979

[54] SUPERCONDUCTIVE JOSEPHSON CIRCUIT DEVICE

[75] Inventors: Akira Ishida, Tokyo; Hajime Yamada, Tokorozawa, both of Japan

[73] Assignee: Nippon Telegraph and Telephone Public Corporation, Tokyo, Japan

[21] Appl. No.: 843,596

[22] Filed: Oct. 19, 1977

[30] Foreign Application Priority Data

Oct. 27, 1976 [JP] Japan .................................. 51-128232
Dec. 25, 1976 [JP] Japan .................................. 51-157194

[51] Int. Cl.$^2$ ..................... H03K 3/38; H03K 19/195; G11C 19/32
[52] U.S. Cl. ................................... 307/306; 307/212; 307/221 R; 307/277; 357/5
[58] Field of Search .................... 307/212, 221 R, 277, 307/306; 357/5

[56] References Cited

PUBLICATIONS

Y. L. Yao, "Josephson Tunneling Device Shift Register", IBM Technical Disclosure Bulletin, vol. 16, No. 9, Feb. 1974, pp. 3040-3041.

Primary Examiner—John Zazworsky
Attorney, Agent, or Firm—Flynn & Frishauf

[57] ABSTRACT

A superconductive Josephson circuit device for shift register comprises at least three superconductive quantum interference closed loops magnetically connected to each other in series configuration. The superconductive quantum interference loops each include at least one Josephson junction, having a property of causing a magnetic flux to be quantized as a predetermined unit called "flux quantum". The Josephson junction free portions of one loop are arranged in proximity to the Josephson junction free portions of the other loop in a manner to obtain a desired magnetic coupling. Clock current feeding lines for feeding clock currents which bring magnetic flux into the superconductive quantum interference loops are provided to permit a flux quantum number in the loop to be controlled to a predetermined amount (0 or 1). A clock current control circuit controls the supply of the clock current and its timing to permit a flux quantum number "0" or "1" to be shifted as binary information from loop to loop.

8 Claims, 18 Drawing Figures

FIG. 4(a)
"0" TRANSFER
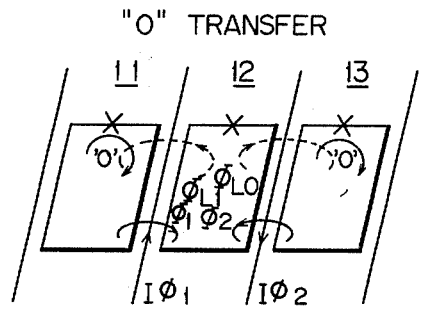
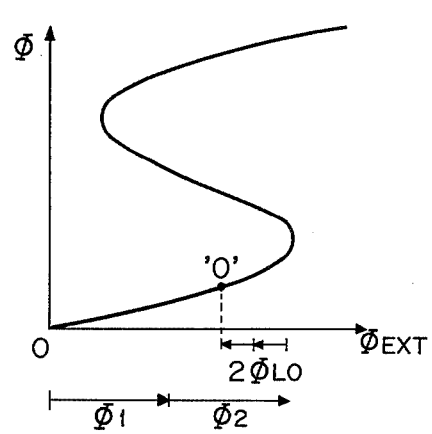
FIG. 4(b)
"1" TRANSFER
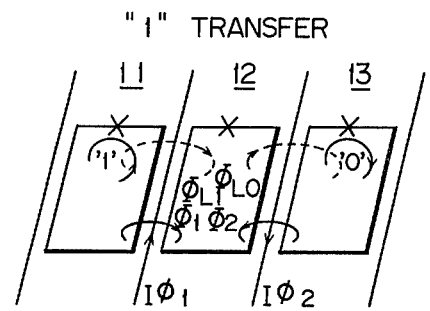
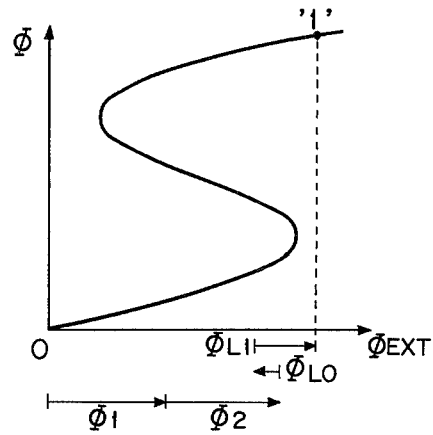
FIG. 4(c)
"1" HOLD
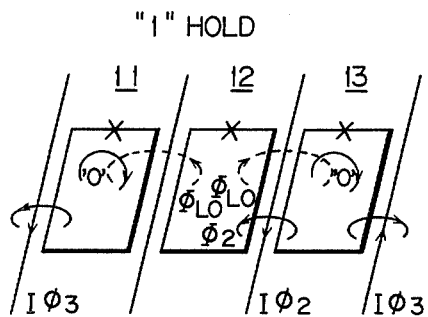
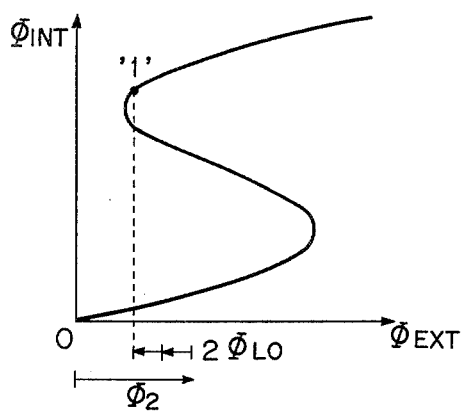
FIG. 4(d)
RESET
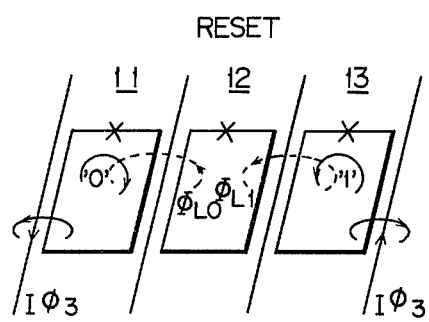
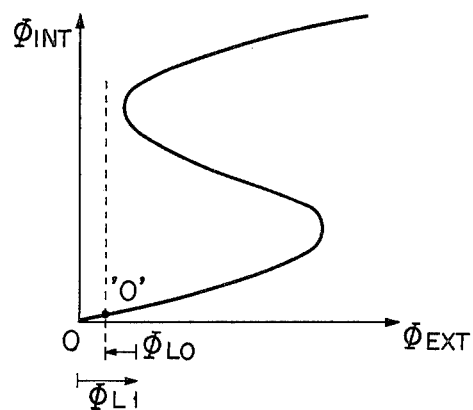

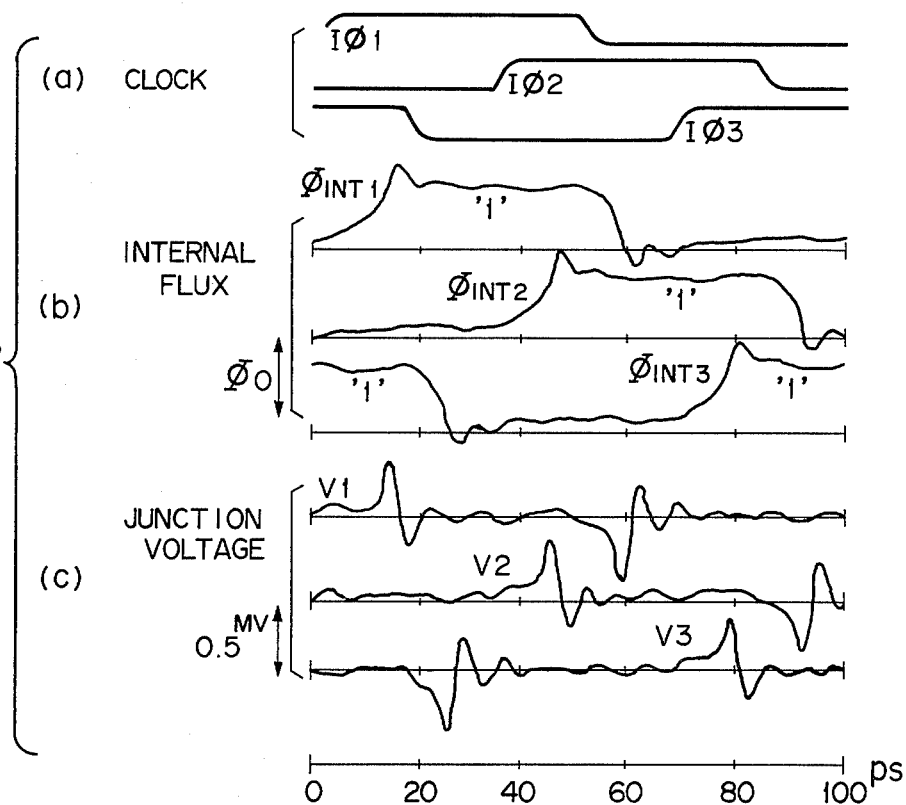
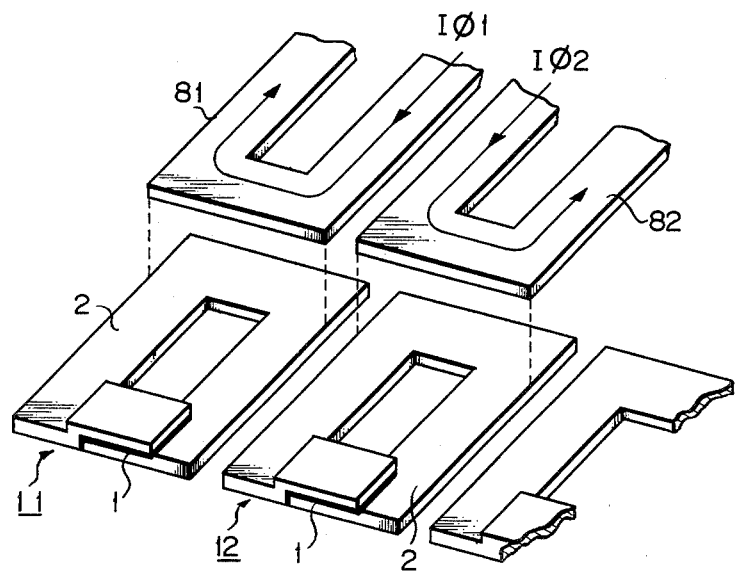

SUPERCONDUCTIVE JOSEPHSON CIRCUIT DEVICE

BACKGROUND OF THE INVENTION

This invention relates to a superconductive Josephson circuit device adapted to shift a flux quantum as an information bit from one superconductive quantum interference loop to another superconductive quantum interference loop by magnetically series-connecting a plurality of superconductive quantum interference loops each having a Josephson junction.

U.S. Pat. Nos. 3,626,391; 3,281,609; 3,758,795; 3,825,906, etc. disclose the concept of utilizing a Josephson junction for Josephson circuit devices as, for example, a memory cell, logic gate or shift register. Such a shift register is shown as comprising a parallel circuit of a first superconductive line including a single Josephson junction and a second superconductive line having a series circuit of an inductive element and resistive element, in which the second superconductive line of a preceding stage is arranged close to the Josephson junction in the first superconductive line of a next subsequent stage so as to obtain a magnetic coupling therebetween. Such an arrangement is called "a current-steering circuit". A control current feeding line is disposed adjacent to the Josephson junction in the first superconductive line. When control current above threshold flows through the control current feeding line, the Josephson junction switches from no voltage state to finite voltage state to permit flowing of current on the second superconductive line. If the current on the second superconductive line which is controlled by such a switching operation corresponds to control current on the above-mentioned control current feeding line, it can be used as control current to the Josephson junction in the first superconductive line of the next subsequent stage to permit sequential shift of the finite voltage state. The circuit arrangement including the above-mentioned Josephson junction, however, involves a great power dissipation, because a voltage on the Josephson junction is long continued. Furthermore, the time for the Josephson junction to be returned to no voltage state after such a finite voltage state has been attained requires more than 10 times as large a time as required when the Josephson junction is switched from no voltage state to a finite voltage state, thus making a required time for binary circuit operation prominently unbalanced. As another example can be listed a superconductive device called "a flux shuttle" which performs a similar operation to a shift register. Such a concept is already disclosed in U.S. Pat. Nos. 3,676,718; 3,936,677, etc. In such a flux shuttle arrangment, two superconductor layers are superposed with an insulating layer for tunneling being interposed therebetween in which insulating layer is make sufficiently thin to permit tunneling of electrons. A Josephson junction is provided in a transmission line form and a bias current source is provided which supplies a bias current between the superconductors. A plurality of control current terminals are provided at predetermined spacings on one of the superconductors. With a DC bias current being supplied from the bias current source, a control current is sequentially supplied in a periodic fashion and a vortex created in the Josephson junction is moved, while trapping a flux quantum, along the Josephson junction transmission line. The flux shuttle arrangement serves substantially as a shift register.

Since, however, the flux shuttle is such that the Josephson junction is formed uniformly over its wide area, it is difficult to manufacture in good yield. When an attempt is made to obtain a high packing density by reducing a spacing required to form one vortex, it is necessary to particularly make a tunneling current density very high and in consequence the insulating layer for tunneling very thin. This provides restrictions to the manufacture of flux shuttles. Where a logic gate such as an AND circuit and an OR circuit is constructed with the flux shuttle arrangement, the Josephson junction transmission line is bifurcated to permit the direction of movement of such a vortex to be controlled. To this end, it is necessary to supply a different control current to each bifurcation according to the function. As a result, a control circuit required for the control of the vortex is made complicated.

SUMMARY OF THE INVENTION

It is accordingly an object of this invention to provide a superconductive Josephson circuit device free from the above-mentioned drawbacks, which includes magnetically series-connected superconductive quantum interference closed loops (hereinafter referred to as SQI loops) to cause a flux quantum trapped in the SQI loop to be shifted as an information bit from loop to loop without directly utilizing the no voltage and finite voltage state of a single Josephson junction.

According to this invention there is provided a superconductive Josephson circuit device for use in a shift register comprising magnetically series-connected SQI loops each including at least one Josephson junction, means for providing a magnetic flux to permit it to be externally applied into the SQI loop, and control means for causing a magnetic flux quantum number to be controlled to 0 or 1 in the SQI loop to permit the flux quantum number representing logic "0" or "1" to be shifted from loop to loop in shift register fashion.

By so doing, the device can be made higher in speed, higher in packing density and lower in power dissipation than the conventional counterparts. Furthermore, the Josephson junction requires only a small area in the formation of the circuit, permitting a high-density circuit to be manufactured with good yield. For the quantitative understanding of the advantages of this invention, experiments were conducted under the same manufacturing techniques. The device of this invention was compared in its performance with the conventional current-steering circuit and in its junction area with the conventional flux shuttle device, the results of which are shown in the following Tables.

Table 1

|  | This invention | Conventional current-steering circuit |
|---|---|---|
| Maximum clock frequency | $\approx$20 GHz | $\approx$1 GHz |
| Bit occupied area | $\approx$10,000 $\mu m^2$/bit | $\approx$50,000 $\mu m^2$/bit |
| Dissipated power | 0.1 $\mu w$/bit | $\approx$20 $\mu w$/bit |

In Table 1, comparison was effected as a computer-simulated shift register. As shown in Table 1, the device of this invention is improved about 10 times as high in its speed and packing density as the conventional counterpart and can be advantageously reduced by a factor of about 100 in its dissipated power in comparison with the conventional counterpart.

Table 2

|  | This invention | Conventional flux shuttle |
|---|---|---|
| Bit occupied area | ~10,000 $\mu m^2$/bit | ~6,000 $\mu m^2$/bit |
| Junction area required | ~600 $\mu m^2$/bit | ~6,000 $\mu m^2$/bit |

As shown in Table 2, the device of this invention can be advantageously reduced by a factor of about 10 in its junction area required, in comparison with the conventional flux shuttle device.

According to this invention an interloop magnetic coupling is selected so as to permit a magnetic flux quantum trapped in the SQI loop to be shifted as a bit information between the adjacent SQI loops. This assures a simplified logic gate configuration, permitting the logic operation to be readily effected.

BRIEF DESCRIPTION OF THE DRAWING

This invention can be described by way of example by reference to the accompanying drawings in which:

FIGS. 4(a) to 4(d), each, are an explanatory view showing the manner in which a flux quantum number between the SQI loops is controlled;

FIGS. 7(a) to 7(c) each show a relation between a clock waveform applied to each of the SQI loops constituting a 3-phase shift register to create an external flux, a computer-simulated junction voltage signal and a computer-simulated internal flux interlinking with each SQI loop;

FIG. 8 shows a superconductive Josephson circuit device according to another embodiment of this invention in which there are provided clock current lines for creating external fluxes in association with the respective SQI loops;

DETAILED DESCRIPTION OF THE PREFERRED EMBODIMENTS

One embodiment of this invention will be explained below by reference to the accompanying drawings.

Figure 1:
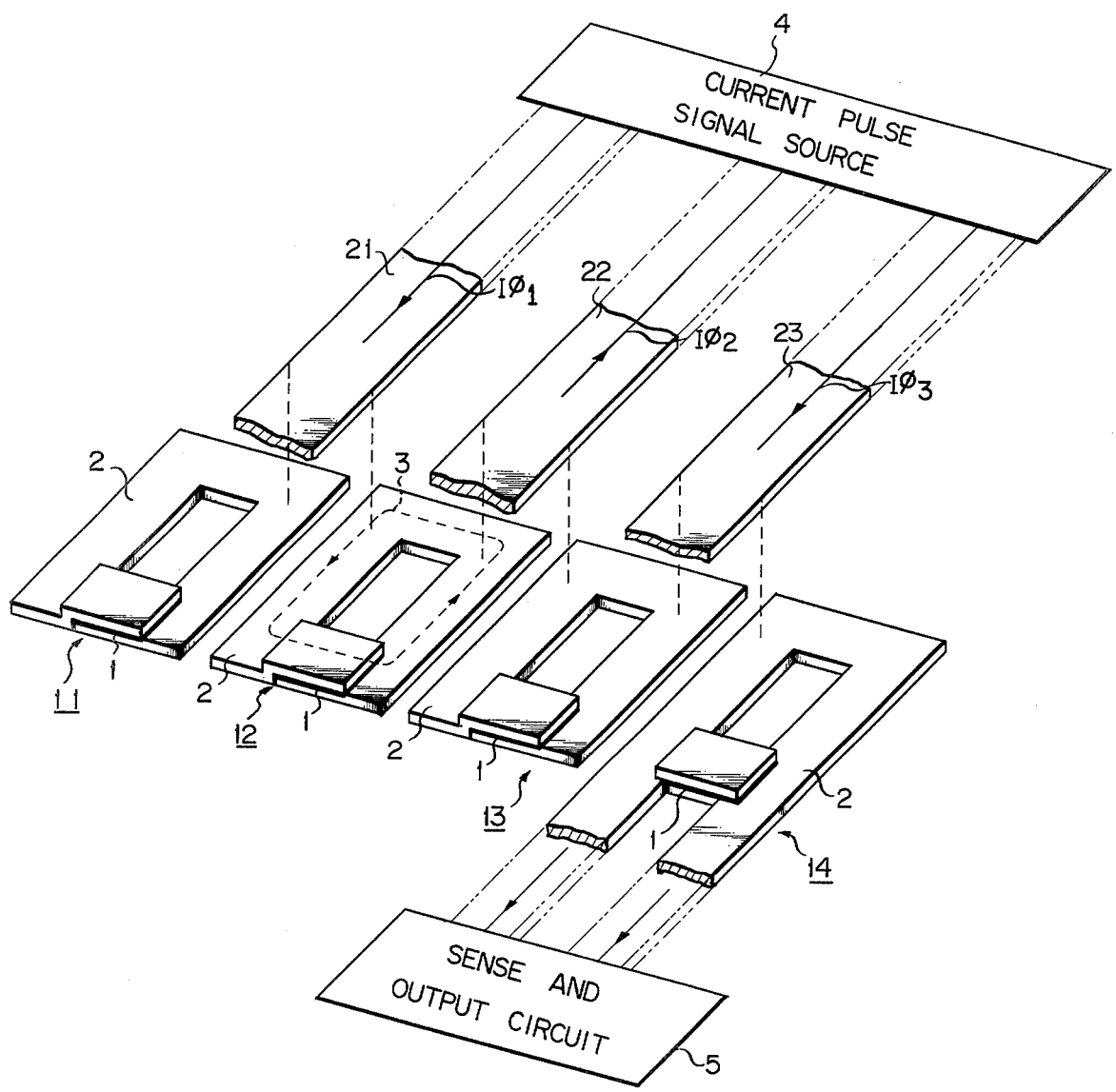
FIG. 1 is a partial, schematic diagram showing a superconductive Josephson circuit device according to one embodiment of this invention.

As shown in FIG. 1 at least more than three unit cells are arranged in a serial configuration, each unit cell constituting a superconductive quantum interference loop (SQI loop) constructed with a superconductive line including one Josephson junction 1. The respective adjacent SQI loops are arranged at a close distance such that a desired magnetic coupling is obtained. Control current lines 21, 22 and 23 are each arranged in the neighborhood of a magnetic coupling between the SQI loops. A desired magnetic flux interlinking occurs in each of the SQI loops 11, 12, 13 . . . by flowing a corresponding control current $I\Phi_1$, $I\Phi_2$, $I\Phi_3$ . . . ) from a current pulse signal source.

Figure 2:
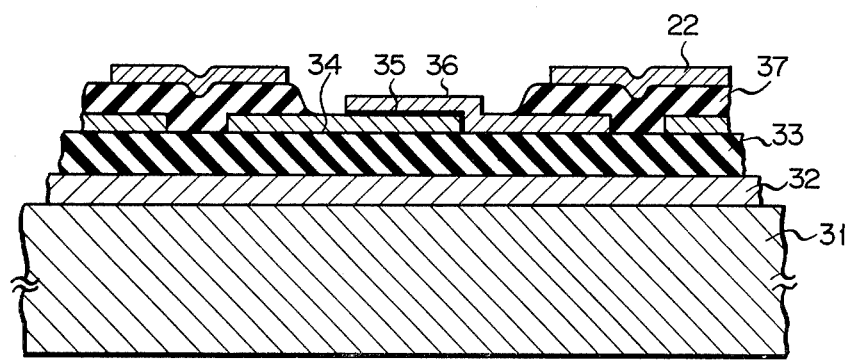
FIG. 2 is a cross-sectional view of the device of FIG. 1 including a Josephson junction.

The arrangement of the unit cell is shown in cross section in FIG. 2. A superconducting ground layer 32 and first insulating layer 33 are formed in that order on the upper surface of a substrate 31. A tunneling layer 35 made of a very thin insulating layer is formed in a manner sandwiched between a lower junction electrode 34 and upper junction electrode 36, both made of a superconductor, whereby a Josephson tunneling junction is provided. The control current line 22 is formed above the upper surface of the magnetic coupling between the adjacent SQI loops through a second insulating layer 37.

When as shown in FIG. 1 a magnetic flux created by the control current is applied to the SQI loop as an external magnetic flux $\Phi_{EXT}$, a circulating current 3 flows through the superconductive line 2, partially preventing the external magnetic flux $\Phi_{EXT}$ from interlinking with the SQI loop. In actual practice, an internal magnetic flux $\Phi_{INT}$ interlinking with the SQI loop is not equal to the external magnetic flux $\Phi_{EXT}$. The relation of the external magnetic flux $\Phi_{EXT}$ to the internal magnetic flux $\Phi_{INT}$ can be expressed as follows:

$$\Phi_{EXT} = \Phi_{INT} + LI_J \sin(2\pi\Phi_{INT}/\Phi_0) \tag{1}$$

where L: a self-inductance of a closed loop provided by the SQI loop;

$I_J$: a maximum Josephson current capable of being carried through the Josephson junction;

$\Phi_0$: a magnetic flux quantum whose value is $2 \times 10^{-15}$ Wb

Figure 3:
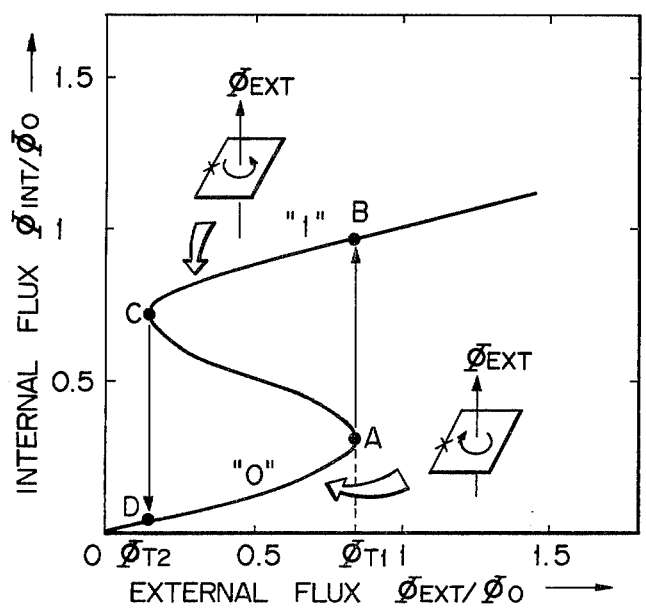
FIG. 3 is a characteristic curve showing the manner in which an internal flux interlinking with an SQI loop induced by an external flux applied to the SQI loop is quantized.

The relation of the external magnetic flux $\Phi_{EXT}$ to the internal magnetic flux $\Phi_{INT}$ is represented by a hysteresis curve of FIG. 3. In the hysteresis curve, transition points A and B each having a different value of internal flux are determined by the external magnetic flux $\Phi_{T1}$, and transition points C and D each having a different value of internal flux are determined by the external magnetic flux $\Phi_{T2}$.

These critical external magnetic fluxes $\Phi_{T1}$ and $\Phi_{T2}$ are so determined that, when the following requirement is met, corresponding magnetic fluxes $\Phi_{INT}$ take different values corresponding to the magnetic quantum numbers "0" and "1", respectively. That is, the product of the inductance L of the closed loop of the SQI loop and the maximum Josephson current $I_J$ must meet the following relation with respect to the magnetic flux quantum:

$$LI_J = \Phi_O \quad (2)$$

As will be evident from the hysteresis curve of FIG. 3 when the external magnetic flux $\Phi_{EXT}$ created by flowing a control current is increased and exceeds a value of $\Phi_{T1}$, the internal magnetic flux $\Phi_{INT}$ is switched, at superhigh speeds, from the "0" quantum state as indicated on the line D-A to the "1" quantum state as indicated on the line B-C of FIG. 3 (the magnetic flux quantum is trapped). When the external flux is decreased below a value of $\Phi_{T2}$, the internal magnetic flux $\Phi_{INT}$ is returned onto the line D-A (the magnetic flux quantum is released). In consequence, logic information "0" or "1" is obtained dependent upon whether the internal magnetic flux $\Phi_{INT}$ interlinking with the SQI loop is on the line D-A or on the line B-C i.e. whether the magnetic flux quantum number in the SQI loop is "0" or "1". The logic operation can be effected by utilizing such logic information.

As shown in FIG. 1 three loops 11, 12 and 13 and corresponding control current lines 21, 22 and 23 are required as a minimum unit for shifting one-bit information. For the predetermined magnetic coupling between the adjacent SQI loops, control of the flux quantum number in the SQI loop, and in consequence information transfer between the adjacent SQI loops can be effected by controlling a supply of control current from the current pulse signal source to the control current lines and its current supply timing. A sensing circuit 5 is adapted to sense shifted information.

The requirements under which binary logic information "0" and "1" are transferred, held or reset with the SQI loops 11, 12 and 13 magnetically coupled to each other will be explained below in connection with the embodiment of FIG. 1 by referring to FIGS. 4(a) to 4(d).

FIG. 4(a) shows the manner in which "0" information is transferred from the SQI loop 11 to the loop 12. Even if in this case control currents $I\Phi_1$ and $I\Phi_2$ flow in the anti-parallel directions, the interloop coupling and control current values are so selected that the SQI loop 12 remains in the "0" state. The requirement for the successful transfer of the "0" information is:

$$2\Phi_{l0} + \Phi_1 + \Phi_2 < \Phi_{T1}$$

where $\Phi_{l0}$: a leakage flux from the "0" state loop.

$\Phi_1, \Phi_2$: external fluxes brought into the SQI loop 12 when the control currents $I\Phi_1$ and $I\Phi_2$ are supplied.

FIG. 4(b) shows the manner in which "1" information is transferred from the SQI loop 11 to loop 12. When the control currents $I\Phi_1$ and $I\Phi_2$ flow in the anti-parallel directions, the interloop coupling and control current values are selected such that the SQI loop 12 is transferred to a "1" state. The requirement for the successful transfer of the "1" information can be expressed as follows:

$$\Phi_{l1} + \Phi_{l0} + \Phi_1 + \Phi_2 > \Phi_{T1}$$

where $\Phi_{l1}$ denotes a leakage flux from the "1" state loop.

FIG. 4(c) shows the manner in which "1" information is held. The interloop coupling and control current value $I\Phi_2$ are so selected that the SQI loop 12 once transferred to the "1" state continues to be held in the "1" state unless the control current $I\Phi_2$ is removed. The requirement for holding the "1" information is:

$$2\Phi_{l0} + \Phi_2 > \Phi_{T2}$$

FIG. 4(d) shows the manner in which the "1" information of the SQI loop 12 is reset. In this case, the control currents $I\Phi_1$ and $I\Phi_2$ are removed and the interloop coupling is so selected that the SQI loop 12 is reset to the "0" state. The requirement under which the "1" information is successfully reset can be expressed as follows:

$$\Phi_{l0} + \Phi_{l1} < \Phi_{T2}$$

A 3-phase shift register can be obtained by supplying mutually 120° out-of-phase clock control currents through the control current lines 21, 22 and 23 and controlling the "0" information transfer, "1" information transfer and "1" information holding and resetting by selecting the interloop coupling and control current values such that all the requirements as explained in connection with FIGS. 4(a) to 4(d) are met.

Figure 5:
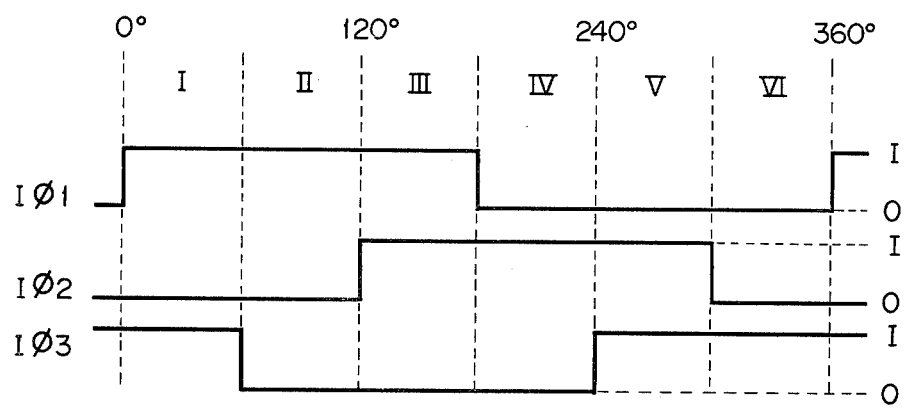
FIG. 5 is a timing chart of a 3-phase current clock for creating an external flux applied to three SQI loops.

FIG. 5 shows the timing chart of the clock control currents in which regions I, II, III, IV, V and VI are marked off at intervals of 60°. In these regions, the flux quantum is operated as follows:

I: "0" or "1" transfer from loop 13 to loop 11
II: Reset of loop 13 and "0" or "1" hold in loop 11
III: "0" or "1" transfer from loop 11 to loop 12
IV: Reset of loop 11 and "0" or "1" hold in loop 12
V: "0" or "1" transfer from loop 12 to loop 13
VI: Reset of loop 12, "0" or "1" hold in loop 13

Figure 6:
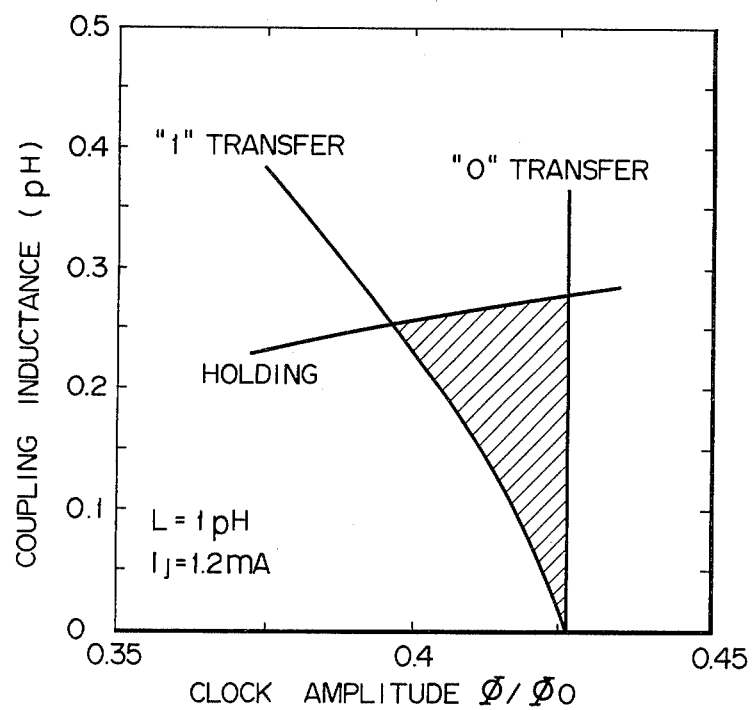
FIG. 6 shows a relation of a coupling inductance between the SQI loop to clock amplitude.

FIG. 6 shows an example showing a typically selected relation of the interloop coupling inductance (pH) to the clock amplitude ($\phi/\Phi_0$). For the Josephson current $I_J = 1.2$ mA and loop inductance L=1 pH, the coupling inductance M and clock amplitude $\phi/\Phi_0$ are selected to be included in a hatched region defined by a "0" information transfer curve, "1" information transfer curve and holding curve.

The following Table 3 shows an applied form of a unit SQI loop including a Pb-PbO-Pb Josephson tunneling junction.

Table 3

| | |
|---|---|
| Josephson current density | J : 400 A/cm$^2$ |
| Junction area | A : 15 × 20 μm$^2$ |
| DC Josephson current | $I_J$: 1.2 mA |
| Junction capacitance | C : 5.3 pF |
| Loop inductance | L : 1 pH |
| Coupling inductance | M : 0.25 pH |

If a 3-phase shift register of a type as shown in FIG. 1 is constructed by using such SQI loops, the shift operation can be computer-simulated as shown in FIG. 7. With the clock control currents $I\Phi_1$, $I\Phi_2$ and $I\Phi_3$ turned ON as shown in FIG. 7(a) a "1" quantum state is transferred from loop 13 to loop 11, thence to loop 12 and thence to loop 13 and sharp voltage spikes are generated, as shown in FIG. 7(c), at the Josephson junction area. In such a 3-phase shift register, the clock control current lines 21, 22 and 23 are each provided above and near to the interloop magnetic coupling and supply external magnetic fluxes to be brought into the SQI loops 11, 12 and 13. Hence an external flux created by a current through one control current line is brought into the adjacent two loops in common. As shown in FIG. 8, however, clock control current lines 81, 82 . . . may be arranged with respect to the corresponding loops 11, 12 . . . , respectively.

Explanation of the embodiment of FIG. 8 and the other following embodiments will be omitted by employing like reference numerals to designate like parts or elements.

Figure 9:
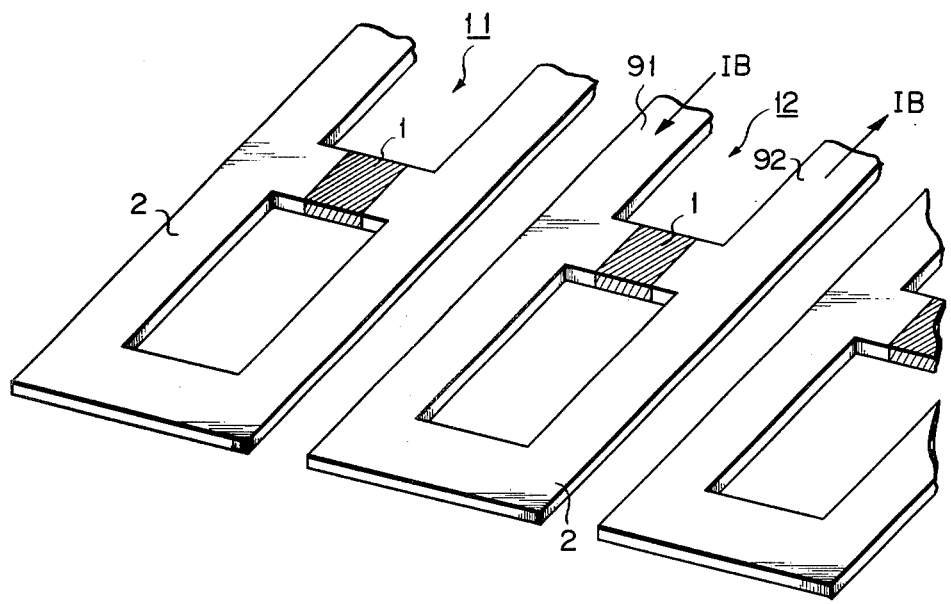
FIG. 9 is a view showing a bias-controlled type SQI loop arrangement according to another embodiment of this invention.

Another embodiment of this invention will be explained by referring to FIGS. 9 and 10. In this embodiment the clock control current lines are omitted and superconductive line portions except for Josephson junctions are extended as shown in FIG. 9 to provide superconductive bias current lines 91 and 92. A magnetic flux interlinking with the SQI loop is controlled by bias current. An external flux applied to the SQI loop of this embodiment has the following relation to an internal flux actually interlinking with the SQI loop.

$$\Phi_{EXT} = \Phi_{INT} - L_1 I_B + (L_1 + L_O) I_J \sin(2\pi \Phi_{INT}/\Phi_O) \quad (2)$$

where $L_O$: an inductance of the Josephson junction side portion of a rectangular closed SQI loop $L_1$: an inductance of three side portions of the rectangular closed loop to the exclusion of the Josephson junction side portion Note: The other symbols are the same as explained in connection with Equation (1) and further explanation is omitted here.

Figure 10:
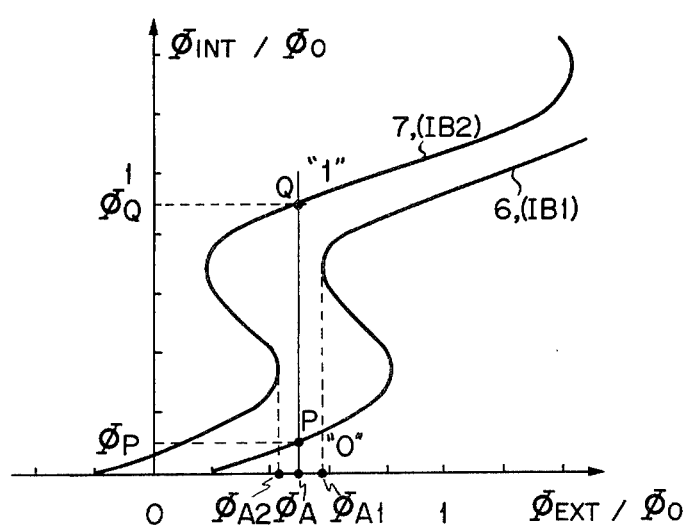
FIG. 10 is a characteristic curve of the FIG. 9 arrangement, showing a relation between an external flux determined by controlling a bias current and an internal flux brought into the SQI loop.

When bias current $I_B$ is flowed into one of the bias current line and flowed out of the other bias current line, there are obtained curves 6 and 7, as shown in FIG. 10, corresponding to the bias current values $I_{B1}$ and $I_{B2}$, which curves show a relation between the external flux $\Phi_{EXT}$ and the internal flux $\Phi_{INT}$. As will be understood from these curves, an external flux $\Phi_A$ can be selected between the external fluxes $\Phi_{A1}$ and $\Phi_{A2}$, such that the internal flux $\Phi_{INT}$ takes a point p ("0" quantum state) on the curve 6 which represents the internal flux $\Phi_p$ and a point Q ("1" quantum state) on the curve 7 which represents the internal flux $\Phi_Q$.

When the bias current values $I_{B1}$ and $I_{B2}$ are $0.8 I_J$ and $-0.8 I_J$, respectively, against the maximum Josephson current $I_J$, the inductance of three side portions of the rectangular closed loop to the exclusion of the Josephson junction side portion is $L_1 = \frac{1}{4}(\Phi_O/I_J)$ and the inductance of the Josephson junction side portion of the rectangular closed loop is $L_O = 1/10(\Phi_O/I_J)$, the external flux $\Phi_A$ is determined in a range of $\Phi_{EXT} = (0.4 \sim 0.6) \Phi_O$. If the relation shown in FIG. 10 is established, the basic operation of the SQI loop is performed. Suppose that with the SQI loop 12 as a reference the preceding loop 11 is in the "1" quantum state and that the leakage flux of the loop 11 brought into the loop 12 is present between the flux ranges $\Phi_{A1}$ and $\Phi_{A2}$. When in this case a bias current $I_{B1}$ is supplied, an internal flux $\Phi_{INT}$ taken in by the loop 12 is a flux $\Phi_p$ corresponding to a point p on the curve 6 as shown in FIG. 10 and it remains in the "0" quantum state. Next when a bias current $I_{B2}$ is supplied, the internal flux $\Phi_{INT}$ of the loop 12 is transferred to a point Q on the curve 7 which represents the flux $\Phi_Q$, transferring to the "1" quantum state. When the bias current value is changed from $I_{B2}$ back to $I_{B1}$, the loop 12 is returned to the point p on the curve 6 which represents the flux $\Phi_p$, causing the loop 12 to be reset to the "0" quantum state.

A shift register can be provided based on the above-mentioned basic operations, by magnetically coupling at least three SQI loops in series configuration and controlling the flux quantum number in each loop and in consequence information transfer between the loops by controlling supply and its timing of the bias currents.

Figure 11:
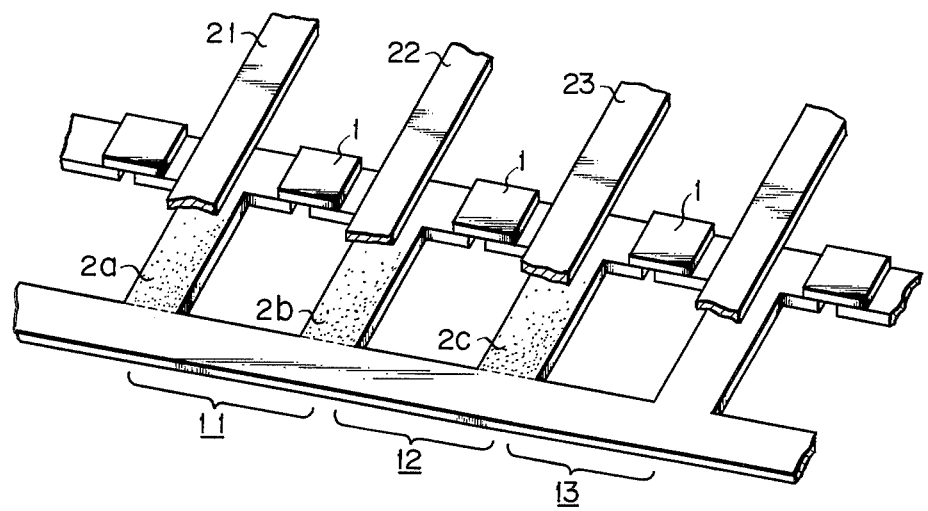
FIG. 11 shows another embodiment of this invention in which respective SQI loops are connected in common with each other.

Although in either of the embodiments of FIGS. 1, 8 and 9 the adjacent loops are magnetically coupled at predetermined spacings, as shown in FIG. 11 a directly connected configuration may be provided in which each rectangular loop has its side portions, except for the Josephson junction side portion, connected in common to each other to provide a common superconductive line as shown in FIG. 11.

Figure 12:
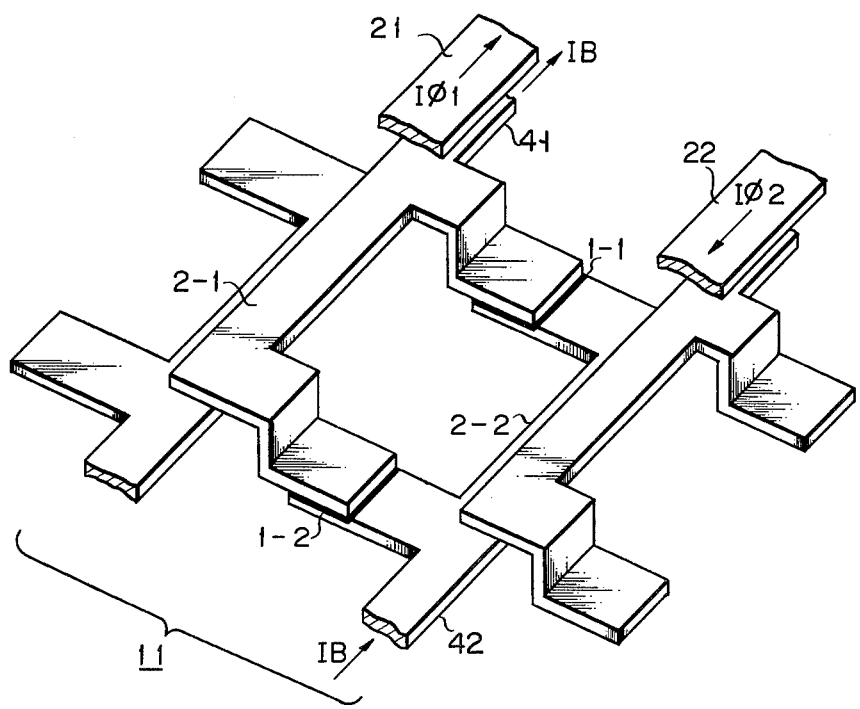
FIG. 12 shows another embodiment of this invention in which each SQI loop has two Josephson junctions.
Figure 13:
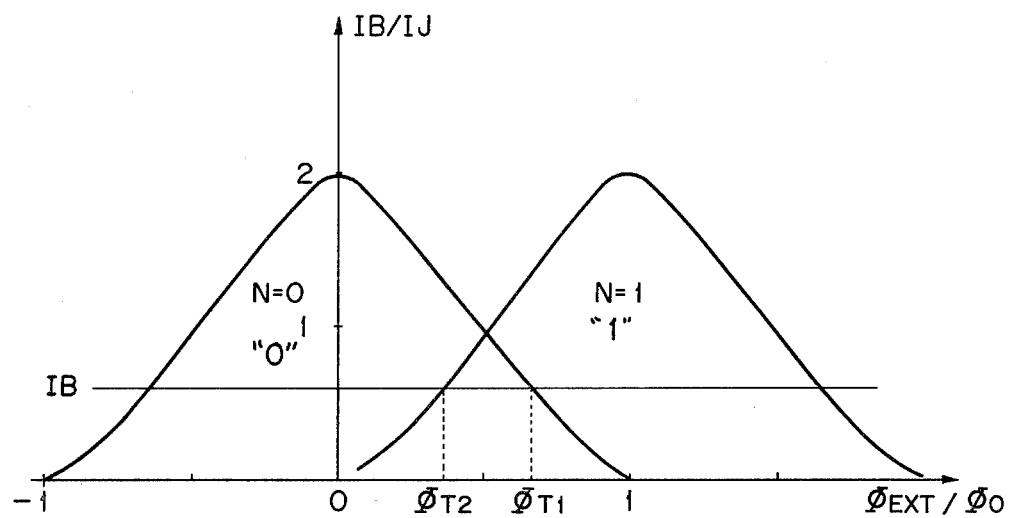
FIG. 13 shows a relation of a bias current to an external flux applied to an SQI loop as observed in the arrangement of FIG. 12.

Another embodiment of this invention will be explained below by referring to FIG. 12. In this embodiment, a plurality of unit SQI loops each comprised of two loop elements are sequentially arranged such that one loop element has at its one side portion two Josephson junctions 1-1 and 1-2 situated on the other loop element. The other side portion of said one loop element which is represented as a superconductive line 2-1 is arranged in proximity to another loop element of the type similar to that of said other loop element. Clock current lines 21 and 22, respectively, are disposed above the superconductive lines 2-1 and 2-2, respectively and supply clock current $I\Phi_1$ and $I\Phi_2$. The superconductive lines 2-1 and 2-2 are extended to provide bias current lines 41 and 42, respectively. When in this embodiment a DC bias current $I_B$ is supplied, a relation as shown in FIG. 13 is established between an external flux $\Phi_{EXT}$ applied to the loop and the flux quantum number N trapped in the loop. Suppose that the external flux $\Phi_{EXT}$ is increased from zero. In this case, the flux quantum number trapped in the loop is $N=0$ unless the external flux $\Phi_{EXT}$ exceeds a first critical value $\Phi_{T1}$. With the external flux $\Phi_{EXT}$ exceeding the first critical value $\Phi_{T1}$ the flux quantum number N changes to "1", causing the loop to be switched to the "1" quantum state. Next, suppose that the external flux $\Phi_{EXT}$ is gradually decreased from a value above the first critical value $\Phi_{T1}$. In this case, the loop remains to be $N=1$ unless the external flux $\Phi_{EXT}$ decreased down to a second critical value $\Phi_{T2}$, a value smaller than $\Phi_{T1}$. When the external flux $\Phi_{EXT}$ becomes smaller than the second critical value $\Phi_{T2}$, the flux quantum number N in the loop becomes equal to zero, causing the loop to be returned to the "0" quantum state. In this embodiment, the external flux $\Phi_{EXT}$ applied to the loop 11 is equal to the sum of a flux created by the currents $I\Phi_1$ and $I\Phi_2$ supplied to the clock current lines 21 and 22 and a leakage flux into the loop 11 which is derived from a flux created at the adjacent loop. In consequence, the basic operation such as a flux quantum number control in the loop and information transfer between the adjacent SQI loops can be performed by selecting the clock control currents $I\Phi_1$ and $I\Phi_2$, bias current $I_B$, magnetic coupling between the adjacent loops, and the timing in which the clock control currents $I\Phi_1$ and $I\Phi_2$ are supplied.

Figure 14:
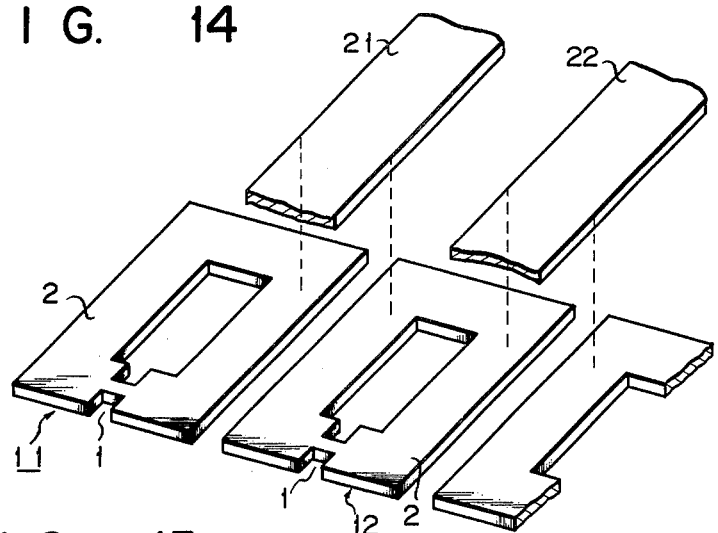
FIG. 14 shows another form of Josephson junction formed in the SQI loop.

Although the Josephson junctions used in the above-mentioned embodiments are all of a tunneling type, they may be of a weak line type as shown in FIG. 14.

Figure 15:
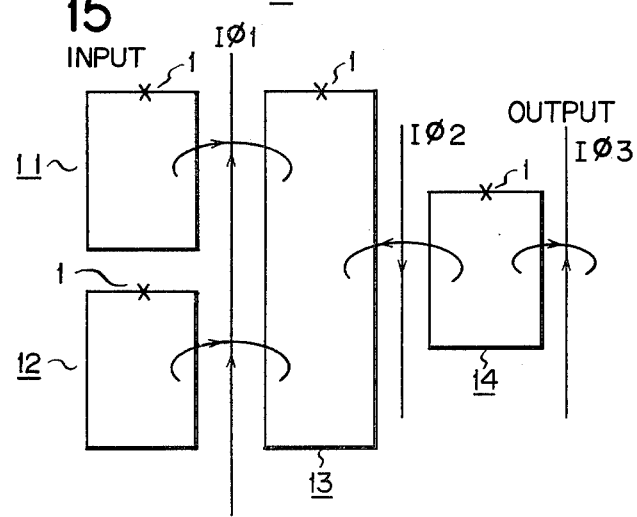
FIG. 15 shows a logic circuit according to another embodiment of this invention as constructed by SQI loops.

In either of the above-mentioned embodiments the shift register is provided by connecting at least three SQI loops in series configuration and controlling the flux quantum number in the loop, and, in this case, utilization is made of the property of the unit cell structure which permits the presence or absence of flux quantum to be controlled as binary information. If the unit SQI loops are arranged as schematically shown in FIG. 15, a logic circuit such as an AND circuit or an OR circuit can be constructed. That is, loops 11 and 12 are arranged in parallel configuration without mutual magnetic coupling and loops 13 and 14 are serially arranged and magnetically connected to each other in that order with respect to the loops 11 and 12. If each interloop coupling is selected such that when the loops 11 and 12 are in the "1" state of the hysteresis curve the loop 13 is also transferred to the "1" state, the arrangement acts as an AND circuit. If, on the other hand, each interloop coupling is selected such that when either one of the loops 11 and 12 are in the "1" state the loop 13 is also switched to the "1" state, the arrangement acts as an OR circuit. The other logic circuits can be properly created by selecting the structure of the SQI loop, the interloop coupling, and the direction and timing in which the control currents and/or bias currents are supplied.

What we claim is:

1. A superconductive Josephson circuit device for use in a shift register, comprising:
   at least three superconductive closed loops, each of said superconductive closed loops including at least one Josephson junction capable of carrying Josephson current $I_J$ and having a Josephson junction free portion including inductance L, wherein the inductance-Josephson current product, $LI_J$, is selected around magnetic flux quantization unit, $\Phi_o = 2.07 \times 10^{-15}$ Webers, whereby trapping and releasing of a magnetic flux quantum are made therein, each closed loop having no resistive component of impedance;
   coupling means for providing a predetermined amount of loop-to-loop coupling so that said superconductive closed loops are magnetically coupled with each other in series fashion such that said Josephson junction-free portion of each superconductive closed loop is located close to the Josephson junction free portion of at least two adjacent superconductive closed loops; and
   shift operation control means for providing a magnetic flux into each of said superconductive closed loops and for causing a magnetic flux quantum to be trapped into the loops or to be released from the loops, whereby a magnetic flux quantum representing a logic "1" data information is sequentially shifted from loop to loop in shift register fashion.

2. A superconductive Josephson circuit device according to claim 1, in which said Josephson junction is of a tunneling type.

3. A superconductive Josephson circuit device according to claim 1, in which said Josephson junction is of a weak link type.

4. A super conductive Josephson circuit device according to claim 1, in which each of said superconductive closed loops includes one Josephson junction, and said loop-to-loop coupling means comprises means for magnetically series connecting said closed loops, such that said Josephson junction free portion of each superconductive closed loop is arranged in the same plane of predetermined spacings in proximity to the Josephson junction free portion of two adjacent superconductive closed loops.

5. A superconductive Josephson circuit device according to claim 1, in which said shift operation control means comprises three control current lines, each arranged in proximity to and substantially above a respective magnetically coupled portion between adjacent superconductive closed loops; and current pulse signal providing means for supplying a respective one of three-phase pulse signals to corresponding ones of said three control current lines.

6. A superconductive Josephson circuit device according to claim 1, in which said shift operation control means comprises three control current lines, individually arranged at predetermined spacings above Josephson respective junction free portions of each superconductive closed loop in one-to-one correspondence; and current pulse signal providing means for supplying a respective one of three-phase pulse signals to corresponding ones of said three control current lines.

7. A superconductive Josephson circuit device according to claim 1, in which each of said superconductive closed loops includes one Josephson junction, and said shift operation control means comprises bias current lines each connected to both electrodes of the Josephson junction of each superconductive closed loop and each constituting an extension of the superconductive line; and current pulse signal providing means for supplying a respective one of three-phase current pulse signals to corresponding ones of three bias current lines.

8. A superconductive Josephson circuit device according to claim 1, in which said superconductive closed loops includes two Josephson junctions connected in parallel and arranged such that the Josephson junction free sections of each superconductive closed loop and the Josephson junction free portions of adjacent superconductive closed loops are overlapped at predetermined spacings with respect to each other; said shift operation control means comprises three control current lines, each respectively arranged above said overlapped portions of the closed loops, and current pulse signal providing means for supplying a respective one of three-phase current pulse signals to corresponding ones of said three control current lines; and said circuit device further including bias current lines connected to supply DC bias current to the extension of the superconductive line constituting said closed loop and means for supplying a predetermined DC bias current to each bias current line.

\* \* \* \* \*